US011276678B2

(12) United States Patent
Tucker

(10) Patent No.: US 11,276,678 B2
(45) Date of Patent: Mar. 15, 2022

(54) WAFER TRUST VIA LOCATION LOCKED CIRCUIT LAYOUT WITH MEASURABLE INTEGRITY

(71) Applicant: Honeywell International Inc., Morris Plains, NJ (US)

(72) Inventor: James L. Tucker, Clearwater, FL (US)

(73) Assignee: Honeywell International Inc., Charlotte, NC (US)

( * ) Notice: Subject to any disclaimer, the term of this patent is extended or adjusted under 35 U.S.C. 154(b) by 0 days.

(21) Appl. No.: 16/813,375

(22) Filed: Mar. 9, 2020

(65) Prior Publication Data

US 2020/0212031 A1 Jul. 2, 2020

Related U.S. Application Data

(62) Division of application No. 15/879,219, filed on Jan. 24, 2018, now Pat. No. 10,622,345.

(51) Int. Cl.
*G06F 7/50* (2006.01)
*H01L 27/02* (2006.01)
*H01L 21/66* (2006.01)
*G06F 30/30* (2020.01)

(52) U.S. Cl.
CPC .......... *H01L 27/0207* (2013.01); *G06F 30/30* (2020.01); *H01L 22/34* (2013.01)

(58) Field of Classification Search
USPC .......................... 716/118, 120, 127, 133, 136
See application file for complete search history.

(56) References Cited

U.S. PATENT DOCUMENTS

| | | | |
|---|---|---|---|
| 5,245,543 A | | 9/1993 | Smayling et al. |
| 5,497,378 A | * | 3/1996 | Amini .............. G01R 31/31701 |
| | | | 714/724 |
| 6,336,205 B1 | | 1/2002 | Kurokawa et al. |
| 6,643,828 B2 | | 11/2003 | Naffziger et al. |
| 6,763,485 B2 | | 7/2004 | Whetsel |
| 7,188,043 B1 | | 3/2007 | Wolf |

(Continued)

FOREIGN PATENT DOCUMENTS

CN 106771960 A 5/2017

OTHER PUBLICATIONS

Prosecution History from U.S. Appl. No. 15/879,219, dated Sep. 13, 2019 through Dec. 11, 2019, 33 pp.

*Primary Examiner* — Brian Ngo
(74) *Attorney, Agent, or Firm* — Shumaker & Sieffert, P.A.

(57) ABSTRACT

Techniques to determine whether the design of integrated circuit (IC) has been tampered with during wafer manufacturing by using an enhanced library and layout methodology. The enhanced library may include location sensitive cells networked together in a mesh architecture where paths through the mesh can be used to detect relative position of location sensitive cells. The techniques further include algorithms that fill any unused space on an IC with additional elements from the enhanced library to minimize the opportunity to modify the IC by including additional circuit function or manipulating the layout. By physically locking down the circuit placement such that there is no available area and gives improved ability to detect changes in the physical location behavior of the circuit, therefore reduces the risk that unauthorized circuit manipulation will go undetected.

10 Claims, 6 Drawing Sheets

(56) References Cited

U.S. PATENT DOCUMENTS

| | | |
|---|---|---|
| 7,266,848 B2 | 9/2007 | Moyer et al. |
| 7,487,474 B2 | 2/2009 | Ciplickas et al. |
| 7,656,189 B1 | 2/2010 | Trimberger |
| 7,941,776 B2 | 5/2011 | Majumder et al. |
| 8,051,345 B2 | 11/2011 | GadelRab et al. |
| 8,115,511 B2 | 2/2012 | Or-Bach |
| 8,139,846 B2 | 3/2012 | Bajura et al. |
| 8,397,079 B2 | 3/2013 | GadelRab et al. |
| 8,615,691 B2 | 12/2013 | Dokken et al. |
| 8,713,327 B1 | 4/2014 | Peterson et al. |
| 9,213,866 B1 | 12/2015 | Ahmad et al. |
| 9,396,358 B1 | 7/2016 | Yap |
| 2014/0223389 A1* | 8/2014 | Liao ............... G06F 30/398 716/52 |
| 2015/0061711 A1* | 3/2015 | Hamilton ........... G01R 31/2882 324/750.05 |
| 2015/0219714 A1 | 8/2015 | Hamilton et al. |
| 2016/0203325 A1 | 7/2016 | Eppensteiner et al. |
| 2017/0186706 A1* | 6/2017 | Guilley ............... G09C 1/00 |
| 2019/0229105 A1 | 7/2019 | Tucker |

\* cited by examiner

WAFER TRUST VIA LOCATION LOCKED CIRCUIT LAYOUT WITH MEASURABLE INTEGRITY

This Application is a divisional of U.S. application Ser. No. 15/879,219, filed Jan. 24, 2018, the entire content of which is incorporated herein by reference.

TECHNICAL FIELD

The disclosure relates to integrated circuit integrity.

BACKGROUND

The integrated circuit (IC) design and manufacturing process may include interactions between a customer and an IC foundry. The customer's design team may design, simulate, test and send the design in electronic format to an IC foundry. The electronic file may contain specifications and instructions used in the semiconductor process on how to build the IC. The IC foundry may build the IC and send wafers that include the IC back to the customer for final testing. It may be difficult to detect either inadvertent or malicious changes between the original intended design and the actual manufactured IC component.

SUMMARY

In general, the disclosure is directed to techniques to determine design integrity between an original intended IC design and the manufactured semiconductor product. The techniques of this disclosure include development of an enhanced IC component library with features and design placement rules for layout methodology to result in a Location Locked Circuit Layout with Measurable Integrity (LLCLMI). The enhanced IC component library may include location sensitive cells networked together in a mesh architecture where paths through the mesh can be used to detect relative position of location sensitive cells.

ICs have circuits that are defined in three-dimensional (3D) space for implementation and routing, which may include doped silicon layers, dielectrics and metal interconnect. The techniques further include algorithms that fill any unused space on an IC with additional elements from the enhanced IC library to minimize the opportunity to tamper with the IC by including additional circuit function or by manipulating the circuit layout. Physically locking down the circuit placement such that there is no available area and may give improved ability to detect changes in the physical location behavior of the circuit, therefore reduce the risk that unauthorized circuit manipulation will go undetected.

In one example, the disclosure is directed to a method of designing an integrated circuit (IC), the method comprising: selecting, from an IC component library, a first portion of circuit elements; arranging the first portion of circuit elements to perform a functional operation of the IC; selecting, from the IC component library, a second portion of cells, comprising a plurality of location sensitive circuits (LSCs); arranging the LSCs to form a network of LSCs on the IC, wherein the first portion of cells continues to perform the functional operation of the IC; generating an IC design plan; wherein the IC design plan comprises instructions to an IC design foundry to build an IC component according to the IC design plan, including the first portion of cells and the second portion of cells; generating design integrity baseline information, based on the desired arrangement of the network of LSCs, wherein the design integrity baseline information comprises one or more test vectors, and wherein a first LSC of the plurality of LSCs is in a desired first location according to the design integrity baseline information.

In another example, the disclosure is directed to an IC die comprising: a test interface configured to receive a test vector, a location sensitive circuit (LSC), wherein: the LSC is connected within the IC in a first arrangement, the LSC is positioned at a first location, the LSC is configured to output a first response to the test vector, wherein the first responses of the LSC is based on at least one of: the LSC being positioned at the first location, and the LSC connected in the first arrangement.

In another example, the disclosure is directed to a system comprising, an integrated circuit (IC) component library including one or more location sensitive circuits (LSCs); a processor configured to: select a first LSC and a second LSC from the IC component library; arrange the first LSC and the second LSC to form a network of LSCs on an IC design layout, wherein the first LSC is in a first location on the IC design layout and the second LSC is in a second location on the IC design layout; generate design integrity baseline information, based on the arrangement of the network of LSCs, the first location of the first LSC and the second location of the second LSC, wherein the design integrity baseline information comprises one or more test vectors; and store the design integrity baseline information at a memory location.

The details of one or more examples of the disclosure are set forth in the accompanying drawings and the description below. Other features, objects, and advantages of the disclosure will be apparent from the description and drawings, and from the claims.

DETAILED DESCRIPTION

The disclosure is directed to techniques to determine design integrity between an original intended IC design and the manufactured semiconductor product. The techniques of this disclosure include development of an enhanced IC component library with features and design placement rules for layout methodology to result in a Location Locked Circuit Layout with Measurable Integrity (LLCLMI). The enhanced IC component library may include location sensitive cells networked together in a mesh architecture where paths through the mesh can be used to detect relative position of location sensitive cells.

ICs have circuits that are defined in three-dimensional (3D) space for practical implementation and routing, which may include doped silicon layers, dielectrics and metal interconnect. The techniques further include algorithms that fill any unused space on an IC with additional elements from the enhanced IC library to minimize the opportunity to tamper with the IC. Tampering may include adding a circuit function or by manipulating the circuit layout. Physically locking down the circuit placement such that there is no available area may give an improved ability to detect changes in the physical location or behavior of the circuit. In this manner the techniques of this disclosure may reduce the risk that unauthorized circuit manipulation will go undetected. This disclosure describes practical techniques for reducing the opportunity for a large percentage of the threats for unauthorized circuit modification.

Testing the paths through the mesh architecture of the manufactured semiconductor product may include running automated test programs (ATP) on the semiconductor product, e.g. wafers or IC components received from the IC foundry. An IC component may be referred to as an IC die. The set of test vectors may include tests for the IC functionality, to ensure the IC will work as designed. Other test vectors may include predictive characterization of the location locked cell array within the IC. These location focused test vectors may be kept confidential. Because the test vectors are kept confidential, anyone tampering with the design, such as at the IC foundry, may not know meshes the test vectors will cover and therefore may not be able to hide tampering. The techniques of this disclosure may help to insert trust in the traditional foundry supplier model by implementing an independent method to check, verify and validate that the design received from the foundry supplier is the same as the design that was submitted for manufacturing in the IC design layout file sent to the IC foundry.

Figure 1:
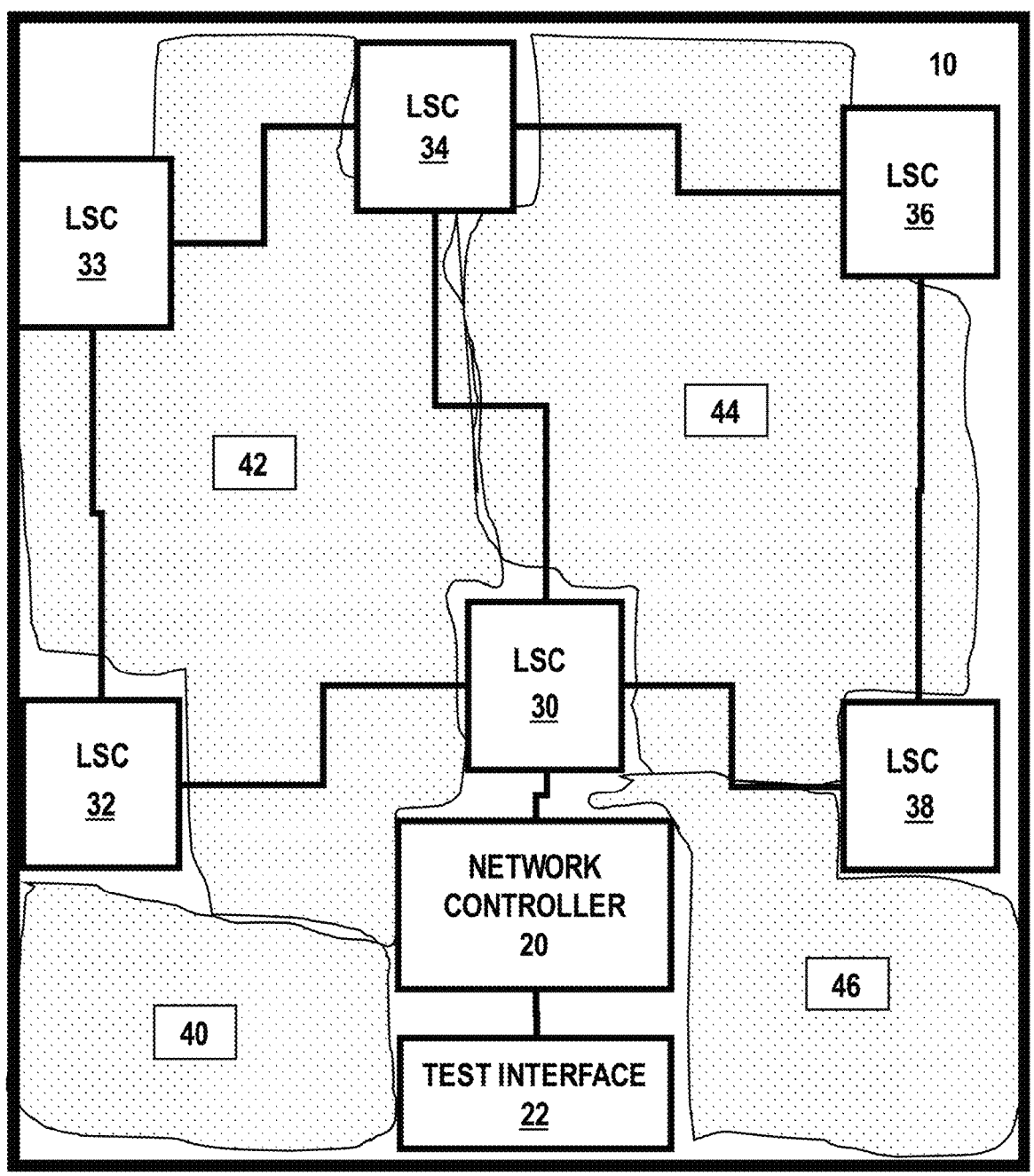
FIG. 1 is a conceptual diagram illustrating an example integrated circuit (IC) that includes location sensitive circuits (LSCs) for design integrity, according to one or more techniques of this disclosure.

FIG. 1 is a conceptual diagram illustrating an example IC that includes LSCs for design integrity, according to one or more techniques of this disclosure. The IC of FIG. 1 may include digital circuits, analog circuits or a combination of both.

IC 10 may include test interface 22, network control element 20, one or more LSCs, 32-38, and one or more portions of other circuit elements, indicated by regions 40-46. IC 10 may be an application specific integrated circuit (ASIC) or other custom IC designed for a particular purpose. Some examples of custom ICs may include a portion of a navigation system or weapons control system on an aircraft, a portion of a weather radar display system, a circuit in a medical device that monitors a patient's condition and delivers needed therapy. Any such custom IC may include amplifiers, sensing circuits, power supplies for a variety of voltage levels, communication interfacing, processing circuitry and many other functions.

In any of the above applications for a custom IC, a malicious party may attempt to insert unwanted portions of a circuit into the IC for a variety of reasons. Some reasons may include to collect unauthorized information from the operation of a system, to cause the system to fail under certain specified conditions, or to allow unauthorized access and control of a device or system. In some examples, tampering may not be malicious. For example, the IC foundry may make changes to improve yield. Ultimately the foundry is responsible for ensuring good yield, and is may be engaged in support of the design process. The foundry may determine that the original design could be made more robust and have higher yield with some small changes that do not affect the operational function of the IC. After receiving the design layout, the foundry may want to make final producibility tweaks to the design to ensure the best manufacturability. However, it may be difficult to determine whether an IC component received from the IC foundry that is different from the desired design layout was an innocent manufacturability improvement or a malicious tampering. In some examples, it may difficult to determine whether the received IC component is different from the design layout sent to the IC foundry. The techniques of this disclosure may provide several advantages over other techniques to determine if a received IC component is different from the desired design layout.

In the example of FIG. 1, the functional operation of IC 10 may be executed by the circuit elements included in the portions of circuitry in regions 42 and 44 of IC 10. The functional operation may be any of the example applications describe above, such as sensing, power supplies, processing, logic circuits and similar functions. The elements that make up the functional operation portions of IC 10 may be selected from an IC component library which may include elements designed to support the security functions of this disclosure. An IC may include several layers of circuit elements include a ground plane, power plane, communication plane, one or more substrate planes, metal layers, semiconductor layers and other similar layers. Circuit elements in the IC component library require 3D space (e.g. doped silicon layers, dielectrics and metal interconnect) for practical implementation and routing. In this disclosure a library component or cell may include one or more library elements. However, the characteristics of a library element, may apply equally to library components and cells.

In some examples, the library elements may be designed so that a given instance cannot be reduced in area or optimized within the defined area. This ensures that the element cannot simply be redesigned to make space for the insertion of an unauthorized function. In some example, library elements may be designed with obfuscation in mind to resist reverse engineering of the cell. A variety of cells for the same function may be of benefit. For example, the system may have different styles of AND gates that can be picked at random and placed during the place and route. Cells should also be designed to interact with adjacent LSC networks.

The location sensitive circuits may form a second category of circuit elements on IC 10. An LSC, such as LSC 30, may be configured to determine its location on IC 10, such as relative to a datum location, or by some other means. The location of any circuit element, including any of LSCs 30-38, may be a three-dimensional (3D) location. An LSC may be configured to determine a 3D location within IC 10. An LSC may have one or more connections that may be configured as input, output, pass-through or other functions. A signal passing through an LSC may be affected by impedance, time delay or have little to effect.

A plurality of LSCs may be placed on IC 10 without interfering with the functional operation of the IC circuit portions included in regions 42 and 44. The plurality of LSCs may be inserted so as to detect changes in physical placement to adjacent cells. The network of LSCs will include a plurality of configurable asynchronous paths connecting a selection of LSCs. These paths create an LSC network and may be used to characterize the relative position of each cell. The design team may employ an algorithm to generate a series of input test vectors that will define a series of path configurations and using process modeling information generate path characterization predictions. The configuration and prediction data will be referred to as the design integrity baseline information (DIM) and be kept confidential by the design team for use in security characterization testing of the design after manufacture.

IC 10 may also include a third category of circuit elements of a set of packed library cells, indicated by regions 40 and 46. The packed library cells substantially pack the 3D space on IC 10 of any space remaining after placing and routing the element used for the operational function (42 and 44) and the LSCs. By filling substantially all the available space on IC 10 with circuitry that includes the means to electrically audit the approved packing to detect distortion, any attempt to add additional, unauthorized circuit function may be detected. In other words, adding or modifying IC 10 may be more difficult if any modification causes distortion or movement to any of LSCs 30-38, the elements used for operational function (42 and 44) or the packed library cells (40 and 46), and therefore may make unauthorized modification more difficult to accomplish without being detected.

In some examples, the circuit elements from the IC component library used as packed library cells may be functional element that could be used in the functional operation region. For example, a multiplexor used in the functional operation region 42, may also be used in a packed library cell region, such as 40 or 46 to fill the remaining available space. In other examples, the regions 40, 42, 44 and 46 may all comprise the functional operation region of IC 10 and LSCs 30-38 provide both the LSC function as well as the packed library cell function described above. In other words, LSCs 30-38 may substantially fill any remaining space not used by functional operation circuitry in regions 40, 42, 44 and 46. The combination of the specifically design IC component library, along with LSCs and ensuring the 3D space on IC 10 is substantially filled may provide a practical method for reducing the opportunity for a large percentage of the unauthorized circuit modification threats.

Network control element (NCE) 20 configures and characterizes the LSC network. NCE 20 may configure each LSC to define a serial path through the LSC network. Once a serial path through the LSC network is configured, NCE 20 may apply a stimulus and take measurements along the configured path to determine the characteristics of the path. In some examples, NCE 20 may determine a time delay for a stimulus to travel through a configured path. In other examples NCE 20 may check for other measurements, such as impedance of a serial path. NCE 20 may configure more than one serial path through a given set of LSCs. For large designs, a hierarchy of NCE devices may be employed, each NCE with an associated LSC network.

During the design phase for IC 10, the design team may employ one or more algorithms to generate a series of input test vectors. Functional test vectors may test the functional operation of IC 10. Functional test vectors may be shared with the IC foundry, or an outside test facility, to determine manufacturing yield and verify the correct function of IC 10. Security test vectors may define a series of path configurations and using process modeling information generate path characterization predictions. The configuration and prediction data will be referred to as the design integrity baseline information (DIBI) and the security test vectors will be kept confidential by the design team for use in characterization testing of the design after manufacture and receipt of the IC components.

NCE 20, or multiple NCEs, may be connected to test interface 22 via custom interconnect protocols or any standard protocol such as the Joint Action Test Group (JTAG) IEEE 1164 protocol. NCE 20 may include one or more cryptographic algorithm functions that can introduce access controls for the application of test stimulus to reduce the threat of unauthorized device characterization. In some examples, the cryptographic algorithms functions may control access of test vectors to the IC 10 via test interface.22. In some examples, because of the size of IC 10, and the associated size of the one or more LSC networks, it may be impractical to either model or test every possible serial path. However, the techniques of this disclosure include ensuring that the security test vectors are kept confidential, therefore a third party without access to the security test vectors will not be able to predict exactly how the device is to be interrogated. Therefore, a third party may have difficulty concealing any modifications to the design layout of IC 10.

Test interface 22 may be included in the IC component library. IC 10 may include one or more test interface cells, depending on the size and complexity of IC 10. The techniques of this disclosure include placement algorithms to tightly pack select library cells for required logic functions and insert the network of LSCs, NCEs and a test access port interfaces. NCE 20 may be operatively coupled to test interface 22.

Wafers received from the foundry to a trusted facility may be tested via a probe card where the test access port interfaces will be used to configure and activate device characterization and verify against the DIBI. During the wafer test NCE 20 will be interrogated with the series of path configuration variables defined during the design and verification phase. The characterization data response for each security test vector will be stored and compared against the characterization prediction data in the DIM. Areas where the characterization measurements and predictions diverge may indicate regions of potential circuit modifications. Note that characterization testing could employ environmental controls also including temperature and back voltage. In some examples, security test vector may be referred to as a characterization test vector.

The techniques of this disclosure of this disclosure may include several advantages over other techniques, such as X-ray scanning. The enhanced, IC component library, tightly packed cells, LSC network and confidential security test vector techniques may offer a scalable solution that will work as process nodes become smaller and the capabilities of traditional inspection tools lag in the ability to resolve the smaller feature sizes. The security test vector testing may also be computationally efficient so that as gate density continue to increase validation can occur in an acceptable time. In examples of IC 10 that include logic resources the techniques of this disclosure include the ability to tailor the overhead imposed by the solution. An IC is first and foremost designed to do something, in other words, IC 10 includes functional operation circuitry, as described above for regions 42 and 44. These techniques include a tailorable trade between trust and performance. Other advantages include verification method is confidential and difficult to spoof. Confidentiality is needed because exposing the verification method, i.e. the security test vectors, would provide the opportunity for circumvention by untrusted parties. Also, the techniques of this disclosure are sensitive to small, obscure and unauthorized modifications to the design and include the ability to tailor security feature insertion to control the amount of overhead and level of detection.

Figure 2:
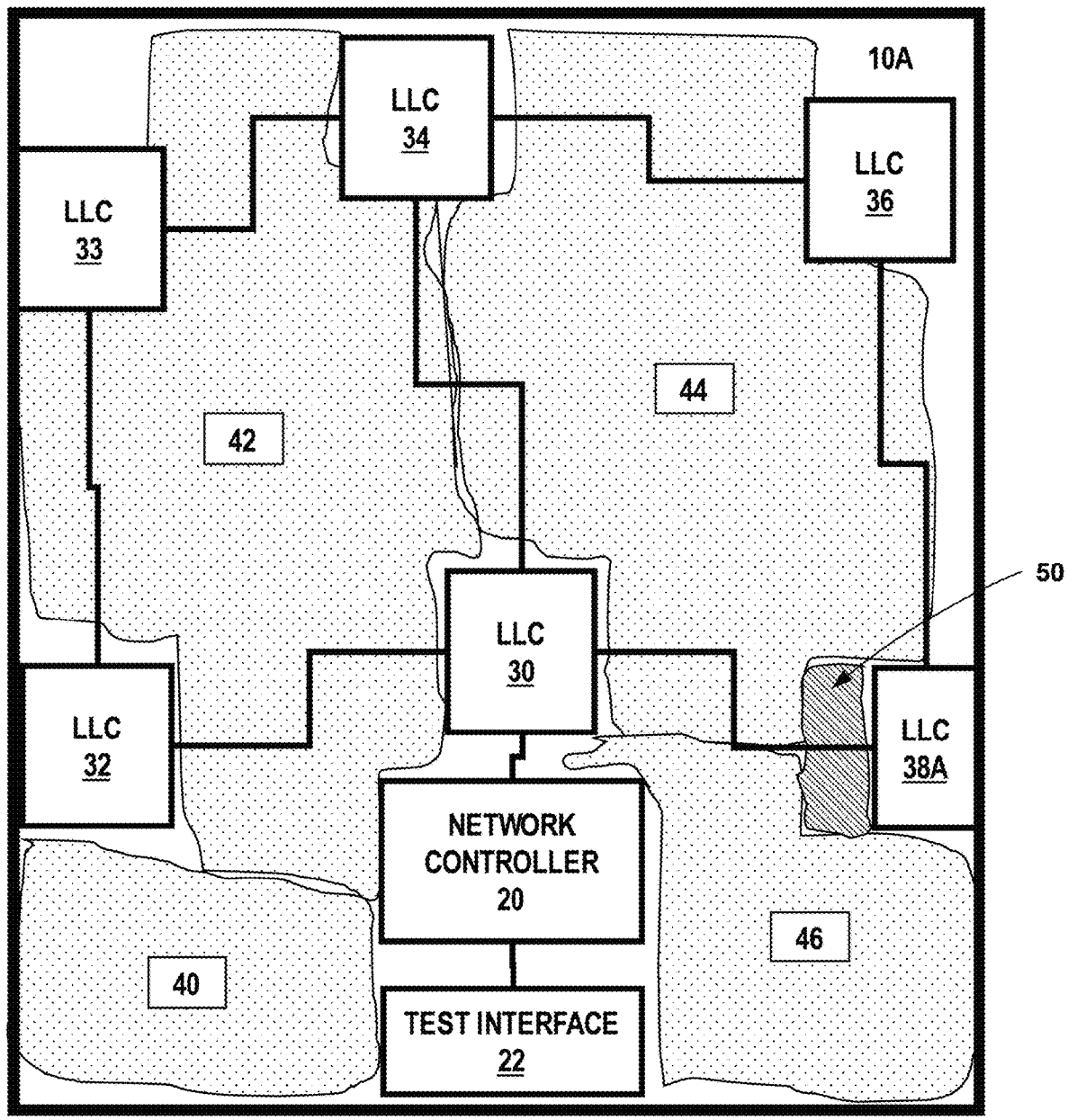
FIG. 2 is a conceptual diagram illustrating an example IC with LSCs and an unauthorized design change, according to one or more techniques of this disclosure.

FIG. 2 is a conceptual diagram illustrating an example IC with LSCs and an unauthorized design change, according to one or more techniques of this disclosure. The example of FIG. 2 depicts an unauthorized modification 50 which has caused a displacement of the tightly packed cells of IC 10A. Other features of IC 10A, such as LSC network 30-36, NCE 20, test interface 22 and circuitry regions 40-46 are similar to the same features described above in relation to FIG. 1.

Unauthorized modification 50 on IC 10A has displaced LSC 38A from the original location defined in the IC design layout during the design and verification phase for IC 10A. In this disclosure, an IC component, such as IC 10A may be a physical output of the IC foundry manufacturing process.

An IC component may be distinguished from an IC design layout for the IC component because the IC component may include manufacturing defects, damage from handling and shipping or unauthorized modifications that differ from the IC design layout. In this disclosure a functional test vector may determine whether an IC functions according to the designed functional operation of the IC. An IC may include an unauthorized modification, or a defect, and still pass the functional tests defined by the functional test vector. A security test vector may determine whether an IC component includes a modification, or defect, that is different than the IC design layout. In response to the IC component failure to match the design integrity baseline information as tested by the security test vector, a test system is configured to output a response indicating an IC integrity failure. In some examples, the LSC network comprising LSCs 30-38A may not be tested by a functional test vector. Both functional test vectors and security test vectors may be applied to either a wafer, or to the diced and separated ICs.

LSC 38A may output a response to a security test vector that differs from the predicted response as stored in the DIBI. For example, the time delay through one or more serial paths that include LSC 38A may be different than predicted. In other examples, LSC 38A may be configured to determine that it is not in its original location and output a response via NCE 20 that LSC 38A is in a different location on the IC component, IC 10A, then expected by the IC design layout.

In some examples, unauthorized modification 50 may change the size of LLC 38A. LLC 38A may output a response to the security test vector indicating that the size of LLC 38A has changed, and therefore indicating an IC integrity failure. For example, an impedance through LLC 38A may be changed as a result of unauthorized modification 50. In other words, the elements of the IC component library, including the LSCs, may include deliberate dimensional properties, as described above in relation to FIG. 1. The library elements of the IC component library of this disclosure may be designed so that a given instance cannot be reduced in area the element cannot be redesigned to make space for the insertion of unauthorized function. In other words, each respective element of the IC component library includes a predetermined size. The size of the element in 3D may include area and volume. Any unauthorized change in size in a respective element may result in a detectable performance change in the respective element. If a test detects a performance change; the test may output a response to the test vectors indicating an IC integrity failure.

In other examples, unauthorized modification 50 may change the interconnections of LLC 38A with the rest of the LSC network. A change in the interconnections in this disclosure may also be referred to as a change in the arrangement of LLC 38A or of the LSC network. In some examples, the arrangement of the serial paths of the LSC network may pass through other elements of either the functional operation portions of circuitry in regions 42 and 44 or the packed library portions 40 and 46 of IC 10, or IC 10A. For example, a logic gate, such as an AND gate, in region 44 may include one or more additional pass through connections beyond the functional input and output connections. NCE 20 may configure serial paths through the LSC network that may include such pass-through connections through other circuit elements from the IC component library. The arrangement of the serial paths and connection ports for the LSC network may be referred to as a predetermined configuration of serial paths.

Therefore, the techniques of this disclosure may detect a change in location on the IC component of any of the elements placed during the design phase, whether the component that moved is one of the functional operation components, packed library components or LSC. In other words, though the connections and function of the IC component may be the same as originally designed, an unauthorized modification that moves a location of one or more elements may be detected. Similarly, an unauthorized modification that changes the connections on the IC component, but leaves the location of the elements as originally designed may also be detected.

Figure 3:
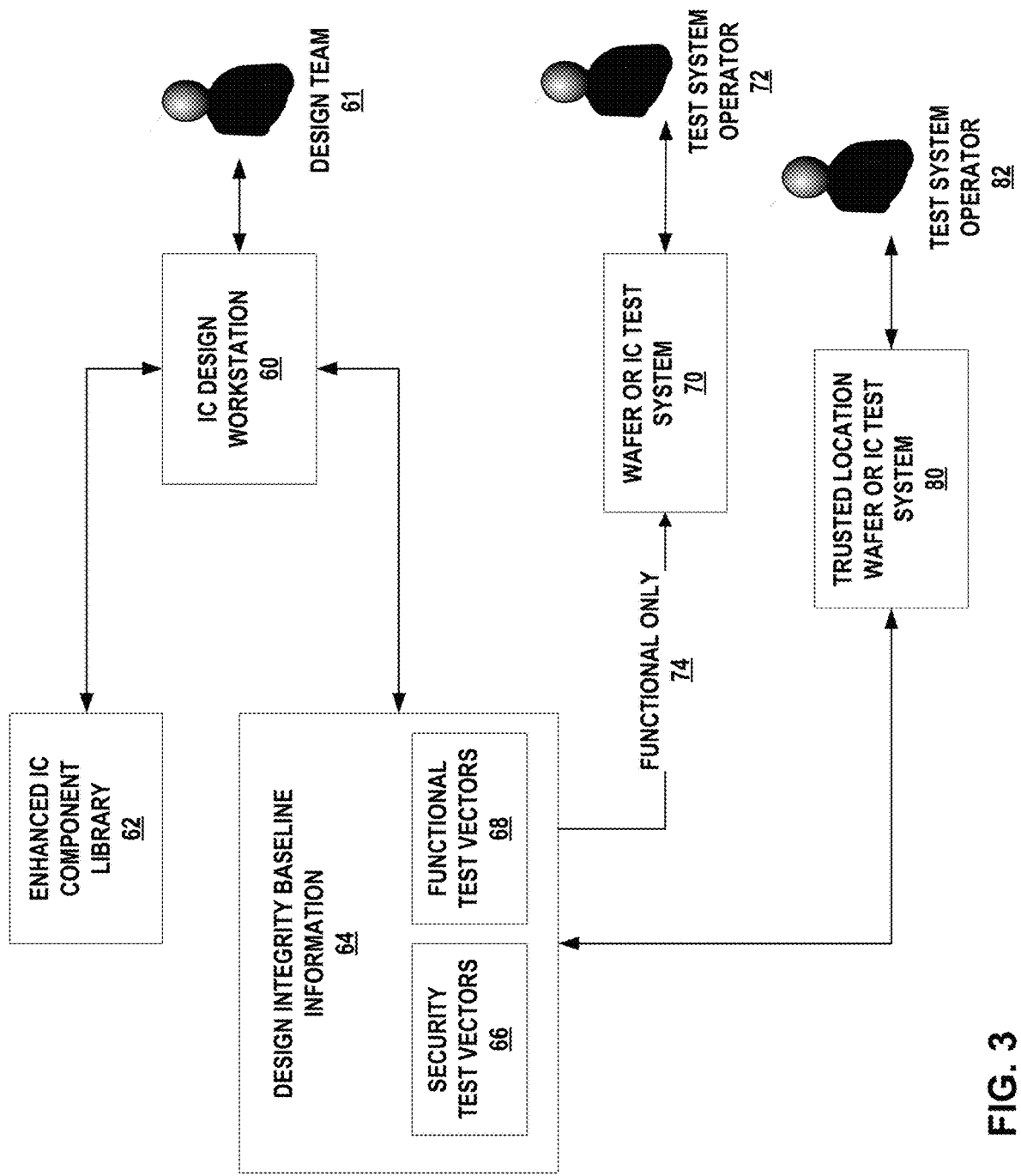
FIG. 3 is a block diagram illustrating an example system for design ICs for design integrity, according to one or more techniques of this disclosure.

FIG. 3 is a block diagram illustrating an example system for design ICs for design integrity, according to one or more techniques of this disclosure. The example of FIG. 3 illustrates one example of a process to keep the security test vectors confidential.

Design team 61 may produce an IC design layout to accomplish a particular function using one or more IC design workstations 60. As described above, an IC can be digital, analog, or a combination of both and perform a variety of functions.

IC design workstation 60 may include customized or standard IC design software that is executed by one or more processors. The IC design software may access enhanced IC component library 62. Enhanced IC component library 62 may include IC elements with deliberate dimensional properties and extra pass through terminals as described above, such as timers, logic gates, as well as LSCs. An LSC may include features that, by measure of relational position, can be predicted via modelling and simulation. Enhanced IC component library 62 may include library elements designed to obscure the intended logic function of a component to reduce the opportunity for reverse engineering. In this manner, component that is harder to understand may also be harder to modify. In some examples, enhanced IC component library 62 may also include standardized library elements that may be found in other component libraries.

Design team 61 may execute algorithms to tightly pack an IC design layout and include one or more NCEs and test interfaces. Once tightly packed, the IC design layout may be considered a location locked circuit design. An unmodified IC component built according to the location locked IC design may be considered a location locked IC. Design team 61 may further execute algorithms to develop both functional test vectors 68 and security test vectors 66 to be stored as design integrity baseline information, DIBI 64. DIBI 64 may be a memory location in a trusted area such that the information in DIBI 64 may be kept confidential.

As described above, functional test vectors 68 may be shared with an untrusted third party, such as an IC foundry, outside IC processing and testing facility or other location. Functional test vectors 68 may be sent (74) to one or more wafer and/or IC test systems 70 at the untrusted location. A test operator 72 may verify the functional operation of a wafer or IC as part of the IC manufacturing process.

Both security test vectors 66 and functional test vectors 68 may be shared with the wafer or IC test system 80 at a trusted location. A test operator 82 at the trusted location may verify both the functional operation and the IC integrity using test system 80.

Figure 4:
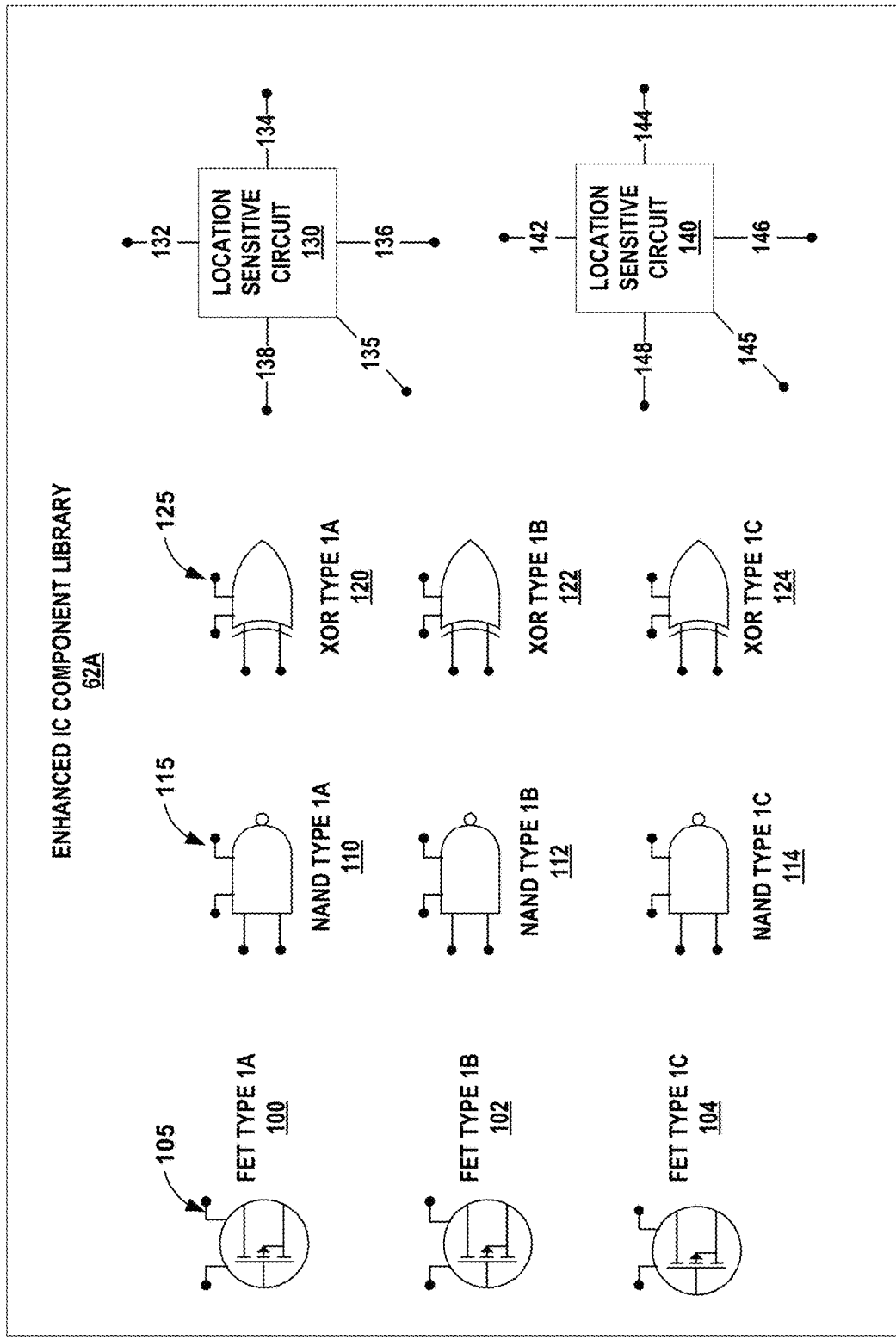
FIG. 4 is a block diagram illustrating an example IC component library according to one or more techniques of this disclosure.

FIG. 4 is a block diagram illustrating an example IC component library according to one or more techniques of this disclosure. Enhanced IC component library 62A may include a variety of analog and digital components according to the techniques of this disclosure and is similar to IC component library 62 depicted in FIG. 3.

IC component library 62A may include analog components such as FETs 100-104. FETs 100-104 may perform the same functional operation, but have differences related to the security features of this disclosure. For example, the impedance through pass through terminals 105 of FET type 1A 100 may be different than the impedance through the pass-through terminals of FET type 1B 102. The size or configuration of FET type 1C 104 may be different than the size and configuration of FET type 1A 100 and FET type 1B 102. Any of the FETs 100-103 may be used for the same functional operation, and the additional differences between the FETs may not be obvious from the IC design layout data that is sent to the IC foundry.

On example of IC design layout data includes data in a GDSII file. GDSII stream format is a database file format used for data exchange of IC layout artwork. A GDSII file is a binary file format representing planar geometric shapes, text labels, and other information about the layout in hierarchical form. The data can be used to reconstruct all or part of the three-dimensional artwork to be used in sharing layouts, transferring artwork between different tools, or creating photomasks.

Similar to FETs 100-104, NAND gates 110-114 and XOR gates 120-124 may each have the same respective functional operation and may be used either as functional elements or packed library elements in an IC design layout. The algorithms that select elements from the IC component library may select a variety of types of elements for use. Having a variety of types of elements that may perform the same functional operation may have the advantage of making any undetectable modification to an IC design layout more difficult. Any modification attempt may be easier to detect because, for example, using a NAND type 1A 110 in a modification when the IC design layout expects a NAND type 1B 112 may be detectable by the confidential security test vectors. As with FETS 100-104, NAND gates 110-114 and XOR gates 120-124 may have different properties for each respective type, such as detectable differences for signals through the pass-through terminals 115 or 125.

IC component library 62A may also include example LSC 130 and LSC 140. As described above for the analog and digital components, LSC 130 may have detectable differences from LSC 140. As one example LSC 130 may introduce a different time delay for a signal through LSC 130 than the time delay for the same signal through LSC 140.

In the example of FIG. 4, LSC 130 includes interconnections 132, 134, 136 and 138. LSC 130 also includes a routing control input 135. The description below of LSC 130 applies equally to LSC 140 with interconnections 142, 144, 146, 148, and routing control input 145. The interconnections for LSC 130 and LSC 140 may also be referred to as connection ports. LSC 130 will be connected via interconnections 132, 134, 136 and 138 such that LSC 130 connects with other LSCs, and other library elements, via programmable connection points and routing control input 135. In the example of FIG. 4, LSC 130 includes four interconnections. In other examples, LSC 130 may include more than four or less than four programmable interconnections controlled by routing control input 135. To simplify the explanation LSC 130 may be considered to include north connection 132, south connection 136, east connection 134 and west connection 138. LSC 130 will include a routing control element 135 that will determine whether each of the connection points is a source, destination or no connect with the network. For example, the control signal to routing control element 135 could configure LSC 130 so that it accepts a connection from an adjacent cell as input on north connection 132 with output to east connection 134 to another adjacent cell. In some examples an adjacent cell may be another LSC. In other examples an adjacent cell may be a functional cell either acting in a functional operation role, or as a packed library cell.

In some examples, only LSC elements may be used as packed library cells. The algorithms used by design team 61 on workstation 60, described above in relation to FIG. 3 may select LSCs to tightly pack any space remaining on an IC after the functional operation portions have been completed. In other words, the packed library portion of an IC of this disclosure may include only LSCs.

Figure 5:
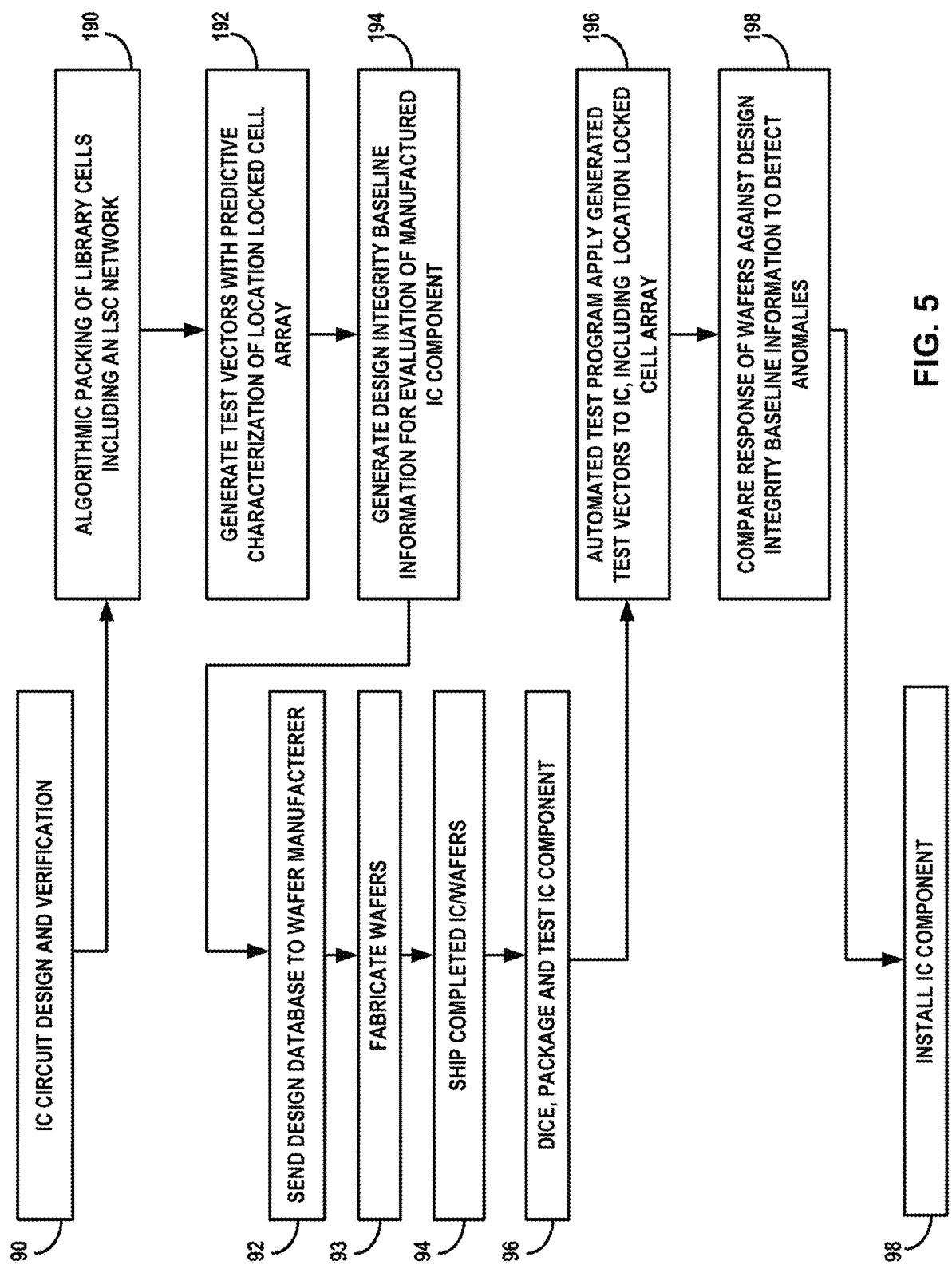
FIG. 5 is a flow chart illustrating an example IC design and manufacturing process that includes design integrity features according to one or more techniques of this disclosure.

FIG. 5 is a flow chart illustrating an example IC design and manufacturing process that includes design integrity features according to one or more techniques of this disclosure. In the example of FIG. 5, the steps 90-98 may include steps in any IC circuit design and manufacturing process. Steps 190-198 may include steps specific to the techniques of this disclosure. The steps of the flow chart of FIG. 5 will be explained in terms of FIGS. 1-4.

During IC design and verification (90), design team 61 may select from IC component library 62 a first portion of circuit elements. The first portion of circuit elements may be arranged to perform the functional operation of the IC, as depicted by regions 42 and 44 in FIG. 1.

Design team 61 may select from IC component library 62 a second portion of circuit elements, which may include a plurality LSCs. Design team 61 may manually, or by running an algorithm, arrange the LSCs to form a network of LSCs on the IC. The functional operation portion continues to perform the functional operation of the IC. In some examples the LSC network will fill all remaining space available on the IC and act as the packed library cells. In other words, design team 61 may perform algorithmic packing of library cells, which includes the LSC network (190). The packed library cells may be substantially invisible to the functional operation of the IC die. Once the IC layout includes the packed library cells, the design may be considered a location locked cell array.

The IC design and verification (90) also includes generating an IC design layout, which may also be called an IC design plan. The IC design layout provides instructions to an IC design foundry to build an IC component according to the IC design plan, and may include the functional operation portion, the LSC network, NCE, test interface, additional packed library cells, where applicable, as well as other features needed to build the IC component.

Design team 61 may generate security test vectors, which may be configured to determine that an LSC in the LSC network is in the desired original location according to the design integrity baseline information. In other words, design team 61 may generate test vectors with predictive characterization of the location locked cell array (192). This process may include generating functional test vectors. In some example, IC design and verification (90) may include circuit simulation to verify IC function and integrity.

IC design and verification (90) also includes generating design integrity baseline information, based on the desired arrangement of the network of LSCs and the test vectors.

The design integrity baseline information includes one or more test vectors including security test vectors for evaluation of the manufactured IC component (194).

In some examples the steps described in FIGS. 3 and 5 may be performed in a different order than described herein. As one example, design team 61 may lay out the functional elements, LSCs and packed library cells as an interactive process, rather than as a single step for portion of cells. In some examples, design team 61, or the IC design software, may insert one or more intermediate circuit optimization steps before generating a final netlist and test vectors.

Once complete, the IC design layout may be sent to the wafer manufacturer, i.e. an IC foundry (92). The IC design layout may be communicated to an IC foundry using GSDII data format, for example.

The IC foundry may fabricate the wafers (93), which in some examples may include process monitoring segments to measure product quality. In some examples, the IC foundry may run wafer tests using functional test vectors, which may be provided by design team 61, or generated by the IC foundry.

The IC foundry may ship the manufactured wafers to the final manufacturing facility (94). In some examples the IC foundry may also dice and separate the wafers into individual IC components. In other examples, the IC foundry may ship wafers to a third party to test and/or dice, separate and package the IC components (96). In other examples, a trusted location may receive the completed wafers, and dice, package and test the ICs (96).

At the trusted location, test system 80 may retrieve the test vectors from the memory location at DIBI 64. Test system 80 may run tests that include both functional test vectors and security test vectors. In other words, testing may include an automated test program (ATP) that may apply generated test vectors to the wafer, or IC component, that may test the location locked cell array (196). The ATP may compare the response of the wafers, or the ICs against the DIBI to detect anomalies, which may indicate unauthorized modification (198). In other words, to verify that the design intended is the design that was manufactured into an IC component. In response to the IC component failure to match the DIBI, test system 80 may be configured to output a response indicating an IC integrity failure. Once tested and verified, the completed ICs may be installed in the circuits (98) where they will be used, e.g. radar system, navigation system or other systems as described above.

Figure 6:
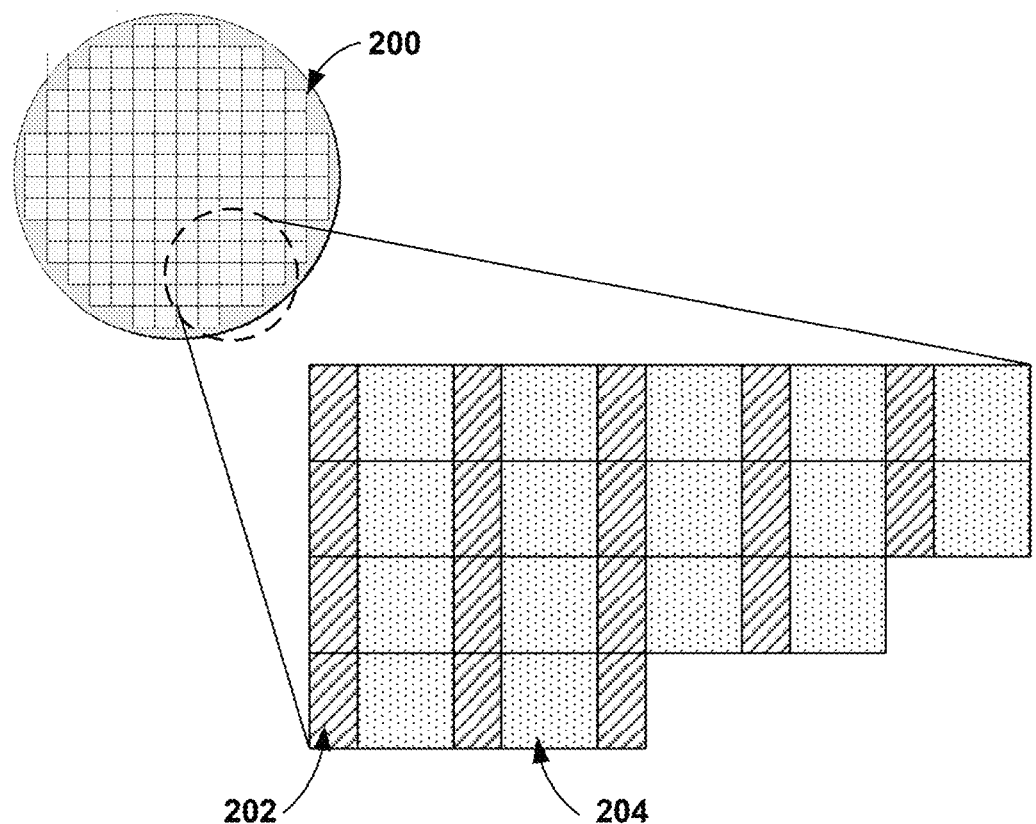
FIG. 6 is an example wafer with process monitoring portions and design integrity features according to one or more techniques of this disclosure.

FIG. 6 is an example wafer with process monitoring portions and design integrity features according to one or more techniques of this disclosure. FIG. 6 provides additional details to the fabricate wafers step (93) described above in relation to FIG. 5.

Wafer 200 may include a plurality of IC components (204), before the IC components are diced, separated and packaged. In some examples, the IC foundry may want to include additional circuitry on an IC for process monitoring (PM). The PM portions may involve unauthorized modification of an IC. Instead, the IC foundry may include additional process monitoring portions 202, which may be referred to as a PMBAR. In this manner the IC foundry may support the manufacturing and design without unauthorized modification to the IC design layout.

In some examples, an IC foundry may determine that some changes in the IC design layout may improve the overall yield, i.e. more passing IC components than IC failed components. For the techniques of this disclosure, an IC foundry may suggest changes to the IC design layout, which may require an additional cycle of generating a new IC design layout, generating new test vectors (both functional and security). The additional cycle may be desirable in applications where IC design integrity is important and prevents unauthorized IC modifications.

In one or more examples, the functions described above may be implemented in hardware, software, firmware, or any combination thereof. For example, the various components of FIG. 3, such as IC design workstation 60 and wafer and IC test system 70, may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media, such as, such as may be included in design and integrity baseline information 64, can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more DSPs, general purpose microprocessors, ASICs, FPGAs, or other equivalent integrated or discrete logic circuitry. Accordingly, the term "processor," as used herein, such as the one or more processors described in relation to IC design workstation 60, may refer to any of the foregoing structure or any other structure suitable for implementation of the techniques described herein. In addition, in some aspects, the functionality described herein may be provided within dedicated hardware and/or software modules configured for performing various techniques described above. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

Various examples of the disclosure have been described. These and other examples are within the scope of the following claims.

The invention claimed is:

1. An integrated circuit (IC) die comprising:
a test interface configured to receive a test vector,
a location sensitive circuit (LSC), wherein:
the LSC is positioned at a first location,
the LSC is configured to output a first response to the test vector, wherein the first response of the LSC is based on:
the LSC being positioned at the first location, and
the LSC is configured to output a second response to the test vector different from the first response when the LSC is positioned at a second location different from the first location during manufacturing.

2. The IC die of claim 1, wherein the LSC is a first LSC of a plurality of location sensitive circuits (LSCs).

3. The IC die of claim 2, wherein the test vector is a first test vector of a plurality of test vectors, the IC die further comprising one or more packed library cells, wherein the packed library cells:
are invisible to a functional operation of the IC die, wherein the functional operation comprises a first portion of circuits, and the LSCs comprise a second portion of circuits on the IC die;
comprise a third portion of circuits of the IC die separate from the first portion and the second portion;
electrically connect to the first portion of circuits and the second portion of circuits such that the one or more packed library cells respond to at least one test vector of the plurality of test vectors, and
wherein the first portion of circuits, the second portion of circuits and the third portion of circuits substantially fill an available area of the IC die.

4. The IC die of claim 2, further comprising a network control element (NCE) operatively coupled to the plurality of LSCs, wherein the NCE is configured to:
define a serial path through the first LSC and a second LSC of the plurality of LSCs;
apply a stimulus to the serial path;
determine a time delay for the stimulus to travel the serial path; and
in response to the time delay being outside of a predetermined range, output a signal indicating an IC integrity failure.

5. The IC die of claim 2, further comprising a network control element (NCE) operatively coupled to the plurality of LSCs, wherein the NCE is configured to:
define a serial path through the first LSC and a second LSC of the plurality of LSCs;
apply a stimulus to the serial path;
determine an impedance for the serial path; and
in response to the impedance being outside of a predetermined range, output a signal indicating an IC integrity failure.

6. The IC die of claim 5, wherein the NCE is further configured to include cryptographic algorithm functions, such that only an authorized test vector may generate an output.

7. The IC die of claim 1, wherein:
the LSC further comprises a routing control input element, a first connection port, and a second connection port;
in response to a routing control signal received by the routing control input element, the LSC defines:
the first connection port as a source; and
the second connection port as a destination.

8. The IC die of claim 1, wherein the test interface is configured to receive test vectors in Joint Action Test Group (JTAG) IEEE 1164 protocol format.

9. The IC die of claim 1, wherein the test interface is configured to output characterization information comprising a temperature characterization, and a voltage characterization.

10. The IC die of claim 1, wherein:
the LSC is connected within the IC in a first arrangement,
the LSC is further configured to output the first response to the test vector based on the LSC being connected in the first arrangement,
the LSC is configured to output the second response to the test vector different from the first response based on the LSC being connected within the IC with a second arrangement different from the first arrangement.

* * * * *